United States Patent
Song et al.

(10) Patent No.: US 8,691,644 B2
(45) Date of Patent: Apr. 8, 2014

(54) METHOD OF FORMING A CMOS DEVICE WITH A STRESSED-CHANNEL NMOS TRANSISTOR AND A STRAINED-CHANNEL PMOS TRANSISTOR

(75) Inventors: Seung-Chul Song, San Diego, CA (US); Amitabh Jain, Allen, TX (US); Deborah J. Riley, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/541,957

(22) Filed: Jul. 5, 2012

(65) Prior Publication Data

US 2014/0011340 A1    Jan. 9, 2014

(51) Int. Cl.
| | |
|---|---|
| *H01L 21/8238* | (2006.01) |
| *H01L 21/336* | (2006.01) |
| *H01L 21/3205* | (2006.01) |
| *H01L 21/4763* | (2006.01) |
| *H01L 21/8234* | (2006.01) |

(52) U.S. Cl.
USPC ........... 438/199; 438/300; 438/299; 438/285; 438/229; 438/938; 438/589; 438/231; 438/275; 438/305

(58) Field of Classification Search
USPC ......... 438/300, 231, 199, 305, 197, 589, 514, 438/530, 229, 299, 938
See application file for complete search history.

(56) References Cited

U.S. PATENT DOCUMENTS

| | | | | |
|---|---|---|---|---|
| 7,129,127 | B2 * | 10/2006 | Chidambaram et al. | 438/231 |
| 7,176,522 | B2 * | 2/2007 | Cheng et al. | 257/338 |
| 7,727,870 | B2 * | 6/2010 | Zhang et al. | 438/589 |
| 7,892,931 | B2 * | 2/2011 | Sridhar et al. | 438/300 |
| 2005/0029601 | A1 * | 2/2005 | Chen et al. | 257/369 |
| 2005/0139872 | A1 * | 6/2005 | Chidambaram et al. | 257/288 |
| 2006/0046367 | A1 * | 3/2006 | Rotondaro et al. | 438/199 |
| 2007/0123010 | A1 * | 5/2007 | Hoentschel et al. | 438/486 |
| 2007/0228482 | A1 * | 10/2007 | Wei et al. | 257/369 |
| 2008/0191243 | A1 * | 8/2008 | Liu et al. | 257/190 |
| 2009/0152626 | A1 * | 6/2009 | Venugopal et al. | 257/338 |

\* cited by examiner

*Primary Examiner* — Mary Wilczewski
*Assistant Examiner* — Erik T Peterson
(74) *Attorney, Agent, or Firm* — Jacqueline J. Garner; Wade J. Brady, III; Frederick J. Telecky, Jr.

(57) ABSTRACT

A method of forming stressed-channel NMOS transistors and strained-channel PMOS transistors forms p-type source and drain regions before an n-type source and drain dopant is implanted and a stress memorization layer is formed, thereby reducing the stress imparted to the n-channel of the PMOS transistors. In addition, a non-conductive layer is formed after the p-type source and drain regions are formed, but before the n-type dopant is implanted. The non-conductive layer allows shallower n-type implants to be realized, and also serves as a buffer layer for the stress memorization layer.

20 Claims, 12 Drawing Sheets

METHOD OF FORMING A CMOS DEVICE WITH A STRESSED-CHANNEL NMOS TRANSISTOR AND A STRAINED-CHANNEL PMOS TRANSISTOR

BACKGROUND OF THE INVENTION

1. Field of the Invention

The present invention relates to CMOS devices and, more particularly, to a method of forming a CMOS device with a stressed-channel NMOS transistor and a strained-channel PMOS transistor.

2. Description of the Related Art

A complimentary metal oxide semiconductor (CMOS) device is a well-known semiconductor device that includes both n-channel (NMOS) and p-channel (PMOS) transistors. Each transistor has spaced-apart source and drain regions, which are separated by a channel, and a gate that lies over and insulated from the channel.

In order to place more and more transistors on a single die, the physical sizes of the NMOS and PMOS transistors have been continually scaled down, but are beginning to reach the physical scaling limits. The performances of the NMOS and PMOS transistors have steadily improved as the physical sizes of the transistors have been scaled down. However, as the physical sizes of the transistors reach the scaling limit, there is a need for other approaches to improve the performances of the transistors.

One approach to improving the performances of scaled-down transistors is to introduce stress into the channel regions of the NMOS transistors, and strain into the channel regions of the PMOS transistors. Increased channel stress increases the mobility of the electrons in NMOS transistors, while increased channel strain increases the mobility of the holes in PMOS transistors.

One technique for introducing stress into the channel region of an NMOS transistor is known as the stress memorization technique (SMT). In this technique, the NMOS transistor is covered with a stress layer, which is commonly a nitride layer. The stress layer is deposited after an n-type dopant has been implanted into the single-crystal silicon to form source and drain implants, but before the source and drain implants have been annealed to form the source and drain regions. In addition, to save a masking step, the stress layer also commonly covers the PMOS transistors.

Implanting n-type dopants, such as phosphorous or arsenic, into single-crystal silicon damages the lattice. To diffuse the implanted dopant and repair the damage, the doped single-crystal silicon is annealed at a high temperature (e.g., 1100° C.) in a neutral ambient such as $N_2$ to recrystallize the silicon.

This high temperature treatment, however, also increases the stress within the stress layer, which transmits the stress to the channel regions of the NMOS transistors. Thus, when the damaged silicon is recrystallized during the anneal, the recrystallization forms a lattice that supports and maintains the stressed channel region.

As a result, the stress layer can be subsequently removed while still maintaining stressed channel regions for the NMOS transistors. To reduce the stress imparted to the channel regions of the PMOS transistors, a p-type dopant, such as boron, can be implanted and then annealed to form p-type source and drain regions after the n-type implant has been annealed and the stress layer has been removed.

One technique for introducing strain into the channel region of a PMOS transistor is to first etch away portions of the p-type single-crystal-silicon source and drain regions to form source and drain cavities. Following this, silicon germanium (SiGe) is grown in the source and drain cavities to form p-type SiGe source and drain regions. The SiGe source and drain regions have a different lattice spacing than the single-crystal-silicon source and drain regions. The different lattice spacing, in turn, introduces strain to the channel regions of the PMOS transistors.

Although a number of approaches have been utilized to form CMOS devices with a stressed-channel NMOS transistor and a strained-channel PMOS transistor, there is a need for additional approaches which require fewer manufacturing steps and are, therefore, less expensive to fabricate.

SUMMARY OF THE INVENTION

The present invention provides a method of forming a CMOS device with a stressed-channel NMOS transistor and a strained-channel PMOS transistor. The method of the present invention implants spaced-apart portions of an n-type single-crystal-silicon substrate region with a p-type dopant, and anneals the n-type single-crystal-silicon substrate region that was implanted with the p-type dopant to form a p-type source region and a p-type drain region that lie spaced apart in the n-type single-crystal-silicon substrate region. The method of the present invention also forms a non-conductive layer that touches an n-channel transistor gate structure and a p-channel transistor gate structure. The n-channel transistor gate structure touches a p-type single-crystal-silicon substrate region. The p-channel transistor gate structure touches the n-type single-crystal-silicon substrate region. In addition, the method implants spaced-apart portions of the p-type single-crystal-silicon substrate region through the non-conductive layer with an n-type dopant, and forms a stress layer that touches and covers the non-conductive layer after the n-type dopant has been implanted. The stress layer is substantially etch selective to the non-conductive layer.

The method of the present invention alternately forms a non-conductive layer that touches an n-channel transistor gate structure and a p-channel transistor gate structure. The n-channel transistor gate structure touches a p-type single-crystal-silicon substrate region. The p-channel transistor gate structure touches an n-type single-crystal-silicon substrate region. The method of the present invention also implants spaced-apart portions of the p-type single-crystal-silicon substrate region through the non-conductive layer with an n-type dopant, and forms a stress layer that touches and covers the non-conductive layer after the n-type dopant has been implanted. The stress layer is substantially etch selective to the non-conductive layer. In addition, the method anneals the p-type single-crystal-silicon substrate region after the stress layer has been formed to form an n-type source region and an n-type drain region that lie spaced apart in the p-type single-crystal-silicon substrate region.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

Figure 1A:
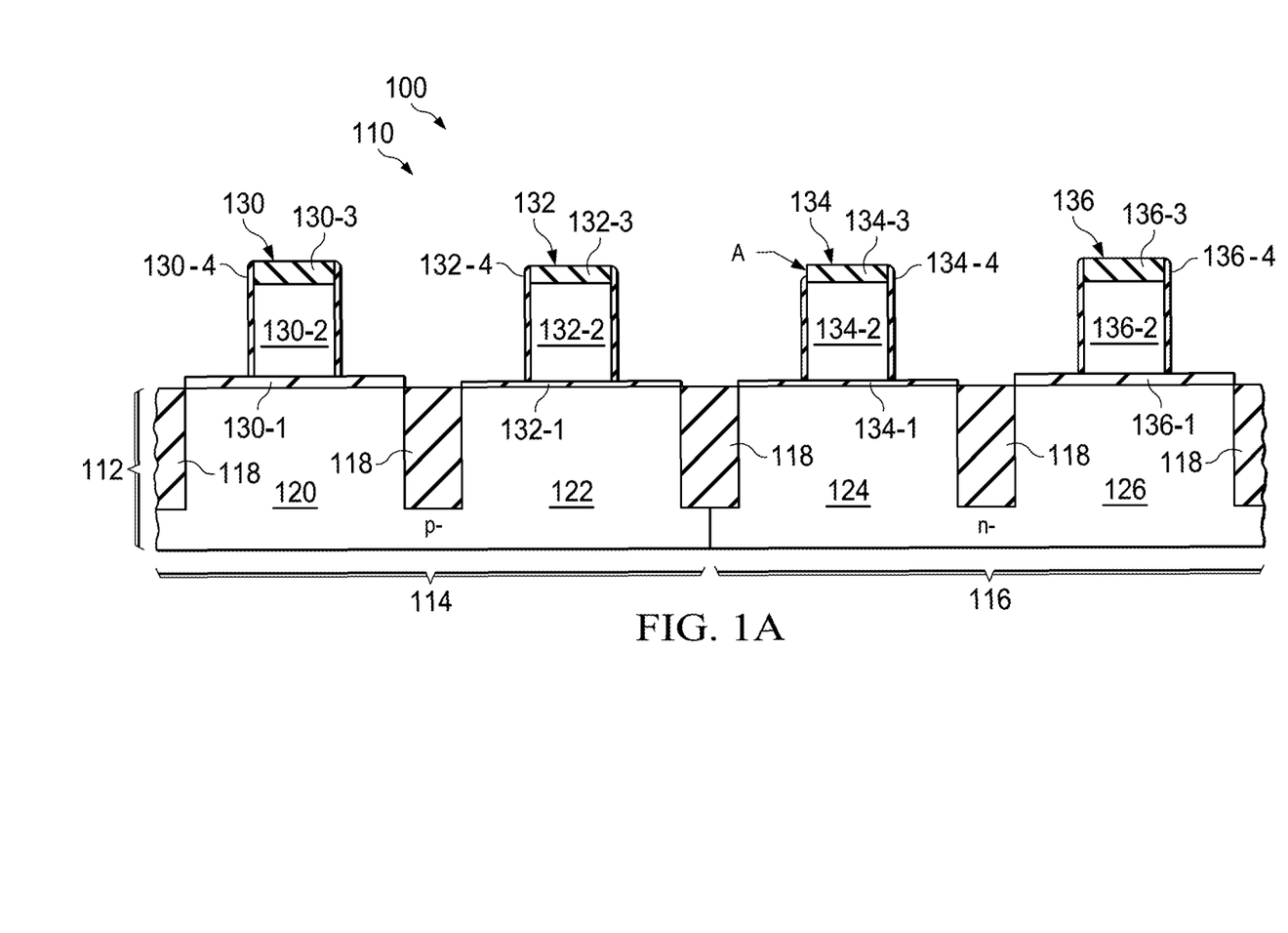
FIGS. 1A-1L are a series of cross-sectional views illustrating an example of a method 100 of forming a CMOS device with a stressed-channel NMOS transistor and a strained-channel PMOS transistor in accordance with the present invention.

FIGS. 1A-1L show a series of cross-sectional views that illustrate an example of a method 100 of forming a CMOS device with a stressed-channel NMOS transistor and a strained-channel PMOS transistor in accordance with the present invention. As shown in FIG. 1A, method 100 utilizes a partially-completed conventionally-formed CMOS device 110.

CMOS device 110, in turn, includes a semiconductor body 112 that has a p-type single-crystal-silicon substrate region 114, an n-type single-crystal-silicon substrate region 116 that touches p-type substrate region 114, and a shallow trench isolation (STI) region 118 that touches and extends into p-type substrate region 114 and n-type substrate region 116.

STI region 118 exposes the top surfaces of and laterally surrounds a p-type high-voltage substrate portion 120 of p-type substrate region 114, a p-type low-voltage substrate portion 122 of p-type substrate region 114, an n-type low-voltage substrate portion 124 of n-type substrate region 116, and an n-type high-voltage substrate portion 126 of n-type substrate region 116.

As further shown in FIG. 1A, CMOS device 110 also includes a high-voltage NMOS transistor gate structure 130 that touches the top surface of high-voltage substrate portion 120, and a low-voltage NMOS transistor gate structure 132 that touches the top surface of low-voltage substrate portion 122. In addition, CMOS device 110 includes a low-voltage PMOS transistor gate structure 134 that touches the top surface of low-voltage substrate portion 124, and a high-voltage PMOS transistor gate structure 136 that touches the top surface of high-voltage substrate portion 126.

In the present example, NMOS transistor gate structure 130 has a gate insulation region 130-1 that touches substrate portion 120, a gate 130-2 that touches and lies above gate insulation region 130-1, a cap region 130-3 that touches and lies above gate 130-2, and a side wall spacer 130-4 that touches gate insulation region 130-1 and cap region 130-3, and laterally surrounds gate 130-2.

In addition, NMOS transistor gate structure 132 has a gate insulation region 132-1 that touches substrate portion 122, a gate 132-2 that touches and lies above gate insulation region 132-1, a cap region 132-3 that touches and lies above gate 132-2, and a side wall spacer 132-4 that touches gate insulation region 132-1 and cap region 132-3, and laterally surrounds gate 132-2.

Further, PMOS transistor gate structure 134 has a gate insulation region 134-1 that touches substrate portion 124, a gate 134-2 that touches and lies above gate insulation region 134-1, a cap region 134-3 that touches and lies above gate 134-2, and a side wall spacer 134-4 that touches gate insulation region 134-1 and cap region 134-3, and laterally surrounds gate 134-2.

PMOS transistor gate structure 136 has a gate insulation region 136-1 that touches substrate portion 126, a gate 136-2 that touches and lies above gate insulation region 136-1, a cap region 136-3 that touches and lies above gate 136-2, and a side wall spacer 136-4 that touches gate insulation region 136-1 and cap region 136-3, and laterally surrounds gate 136-2.

Each of the gate insulation regions 130-1, 132-1, 134-1, and 136-1 can be implemented with, for example, silicon dioxide, with the high-voltage gate insulation regions 130-1 and 136-1 being thicker than the low-voltage gate insulation regions 132-1 and 134-1. In addition, each of the gates 130-2, 132-2, 134-2, and 136-2 can be implemented with, for example, polycrystalline, such as polycrystalline silicon or polycrystalline silicon germanium.

Further, each of the cap regions 130-3, 132-3, 134-3, and 136-3 can be implemented with, for example, silicon nitride. Also, each of the side wall spacers 130-4, 132-4, 134-4, and 136-4 can be implemented with, for example, a layer of nitride which has been anisotropically etched back.

As shown by the arrow A in FIG. 1A, in some cases due to fabrication irregularities as well as other factors, a significant portion of the side wall of a cap region, such as cap region 134-3, can be undesirably exposed during the formation of the side wall spacers 130-4, 132-4, 134-4, and 136-4.

Figure 1B:
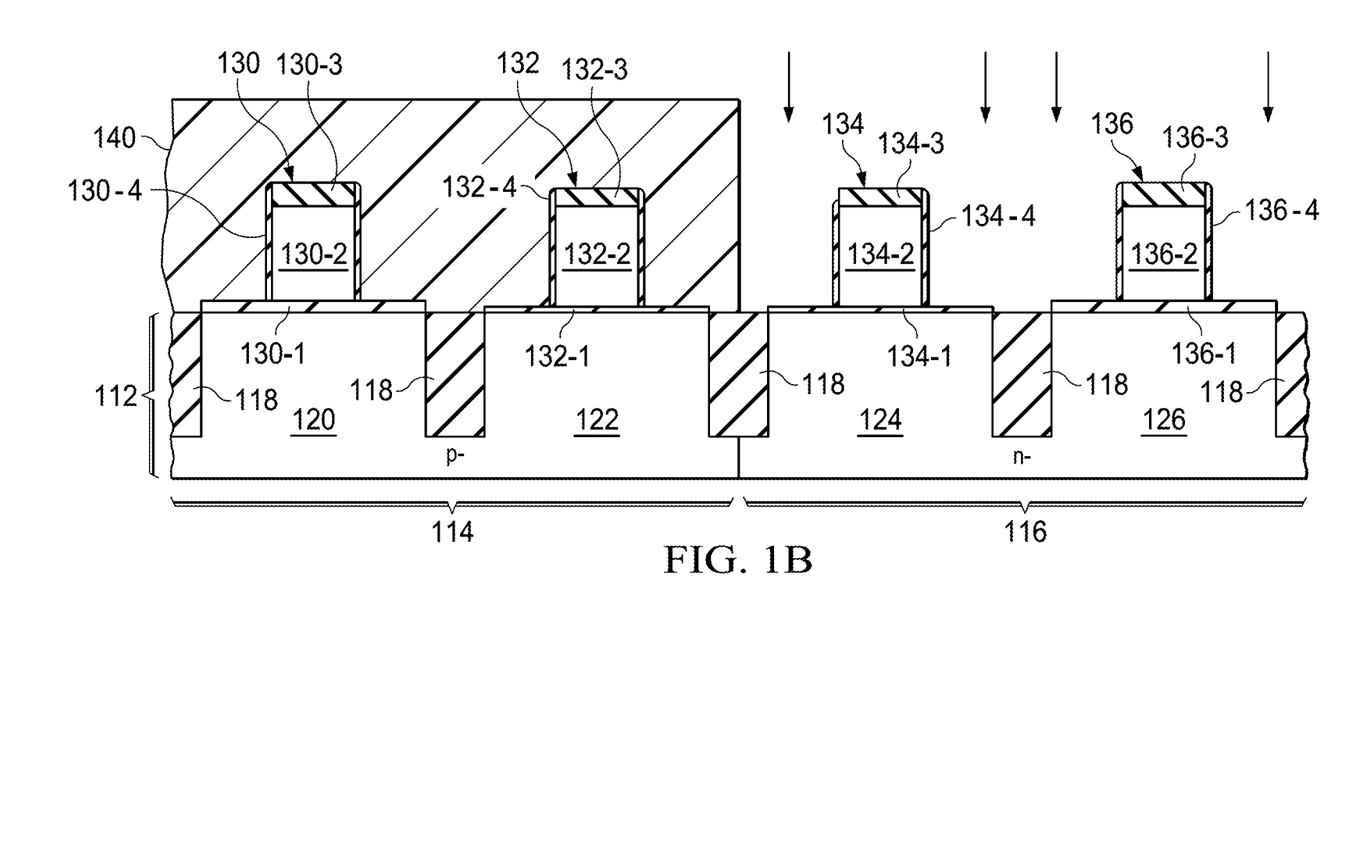

As shown in FIG. 1B, method 100 begins by forming a patterned photoresist layer 140 that touches the NMOS transistor gate structures 130 and 132, and protects the substrate portions 120 and 122 and the NMOS transistor gate structures 130 and 132. Patterned photoresist layer 140 is formed in a conventional manner, which includes depositing a layer of photoresist, projecting a light through a patterned black/clear glass plate known as a mask to form a patterned image on the layer of photoresist, and removing the imaged photoresist regions, which were softened by exposure to the light.

After patterned photoresist layer 140 has been formed, a p-type dopant, such as boron, is implanted into n-type substrate region 116. The p-type dopant can be implanted in a conventional manner. Following the implant, patterned photoresist layer 140 is removed in a conventional fashion.

Figure 1C:
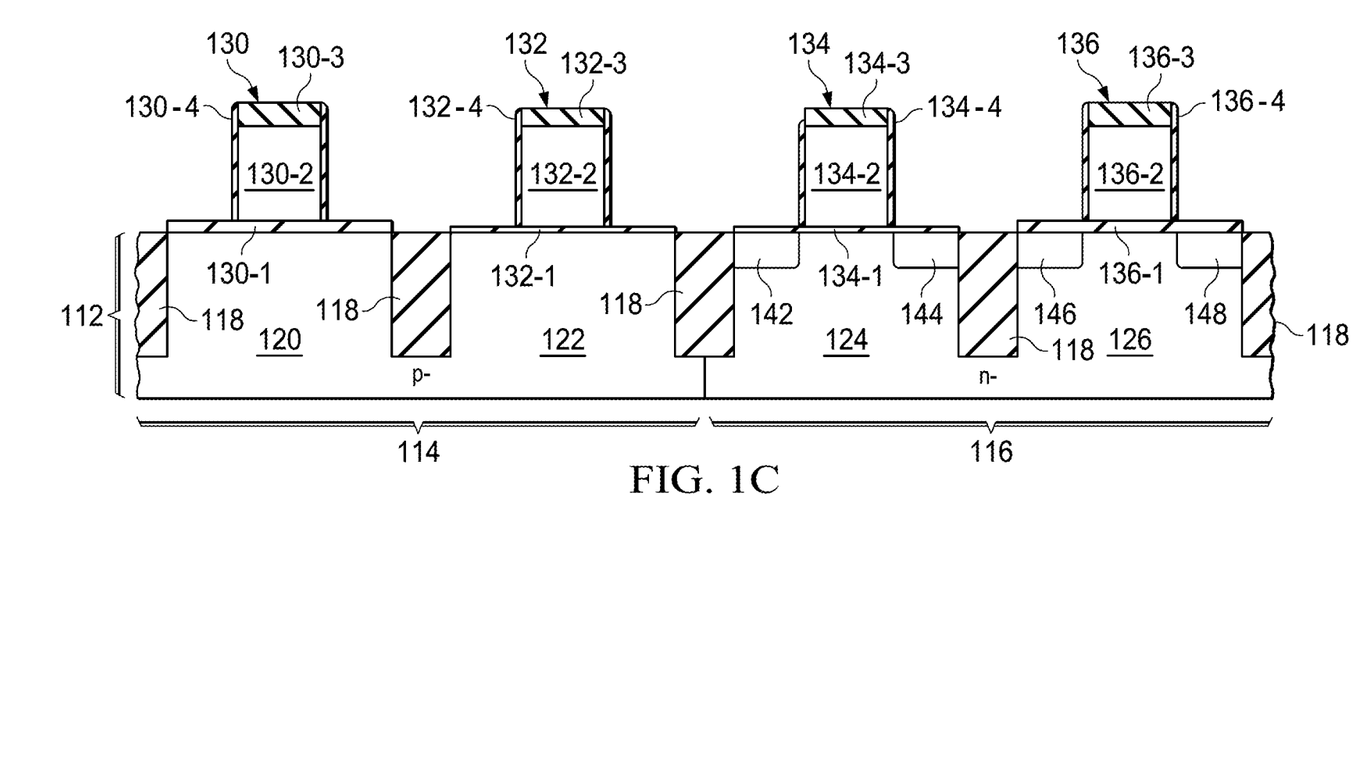

As shown in FIG. 1C, after patterned photoresist layer 140 has been removed, the p-type implant is next driven in (e.g., annealed at 1100° C. in a neutral ambient such as $N_2$) to form spaced-apart PLDD source and drain regions 142 and 144 in substrate portion 124, and PLDD source and drain regions 146 and 148 in substrate portion 126.

Figure 1D:
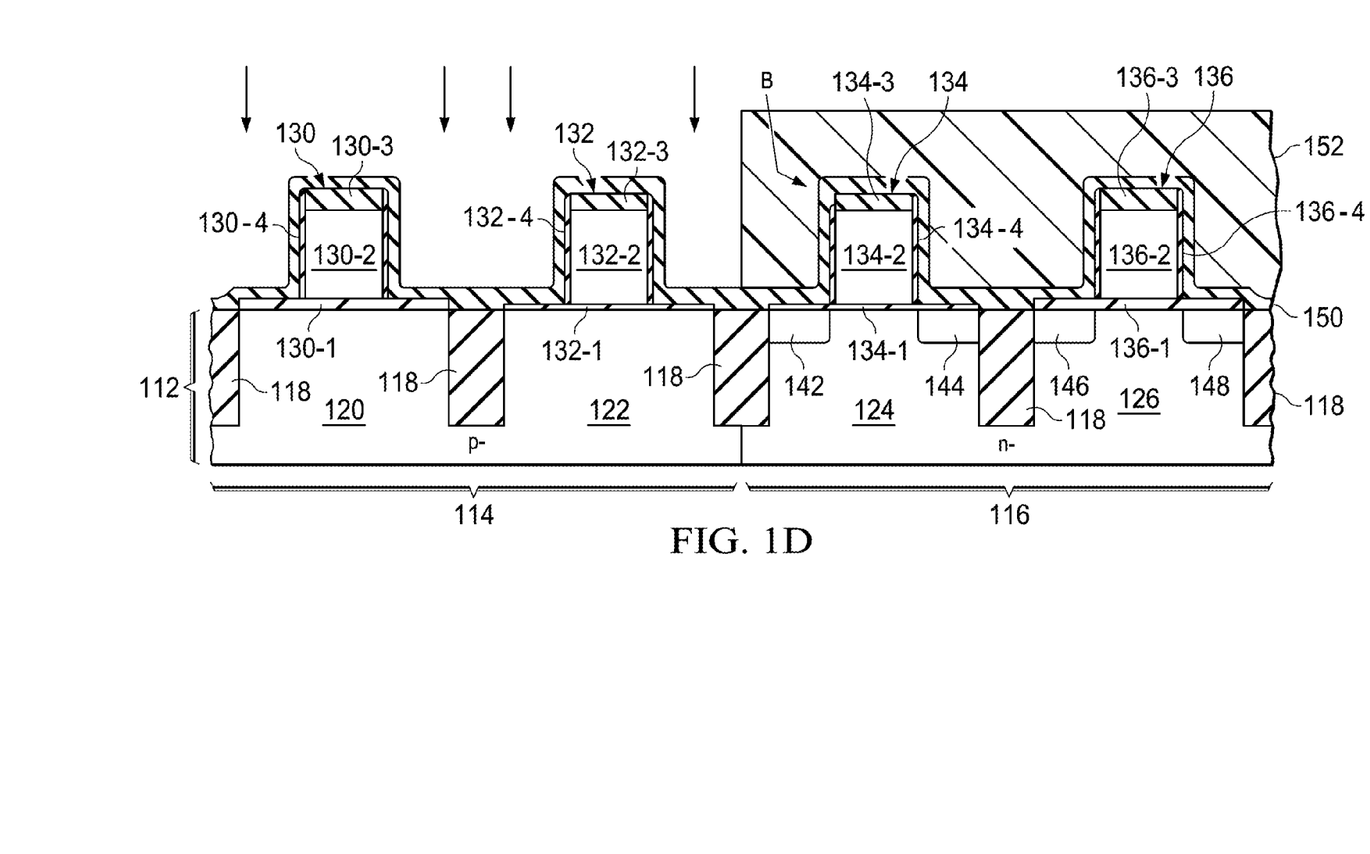

As shown in FIG. 1D, after the PLDD source and drain regions 142 and 144 and the PLDD source and drain regions 146 and 148 have been formed, a non-conductive layer 150 is deposited in a conventional manner. Non-conductive layer 150 touches the NMOS transistor gate structures 130 and 132 and the PMOS transistor gate structures 134 and 136, and lies over the substrate portions 120 and 122, the NMOS transistor gate structures 130 and 132, the PMOS transistor gate structures 134 and 136, the PLDD source and drain regions 142 and 144, and the PLDD source and drain regions 146 and 148.

In the present example, the bottom surface of non-conductive layer 150 is etch selective to the top surfaces of the side wall spacers 130-4, 132-4, 134-4, and 134-6. For example, when the side wall spacers 130-4, 132-4, 134-4 are formed from nitride, non-conductive layer 150 can be formed from oxide.

One of the advantages of non-conductive layer 150 is that non-conductive layer 150 touches and protects any exposed side walls of the cap regions 130-3, 132-3, 134-3, and 136-3, such as the exposed side wall of cap region 134-3 shown by the arrow B in FIG. 1D. When the side wall of a cap region is exposed, the cap region can partially chip or lift off from the underlying gate, thereby undesirably exposing a portion of the underlying gate to subsequent silicon germanium processing steps. Thus, non-conductive layer 150 substantially reduces the likelihood that the underlying gate will be exposed to the subsequent silicon germanium processing steps.

After non-conductive layer 150 has been formed, a patterned photoresist layer 152 is formed in a conventional manner. Patterned photoresist layer 152 touches non-conductive layer 150, and protects the substrate portions 124 and 126 and the PMOS transistor gate structures 134 and 136.

After patterned photoresist layer 152 has been formed, an n-type dopant, such as phosphorous or arsenic, is implanted into p-type substrate portion 120 and p-type substrate portion 122 in a conventional manner. Following the implant, patterned photoresist layer 152 is conventionally removed.

Figure 1E:
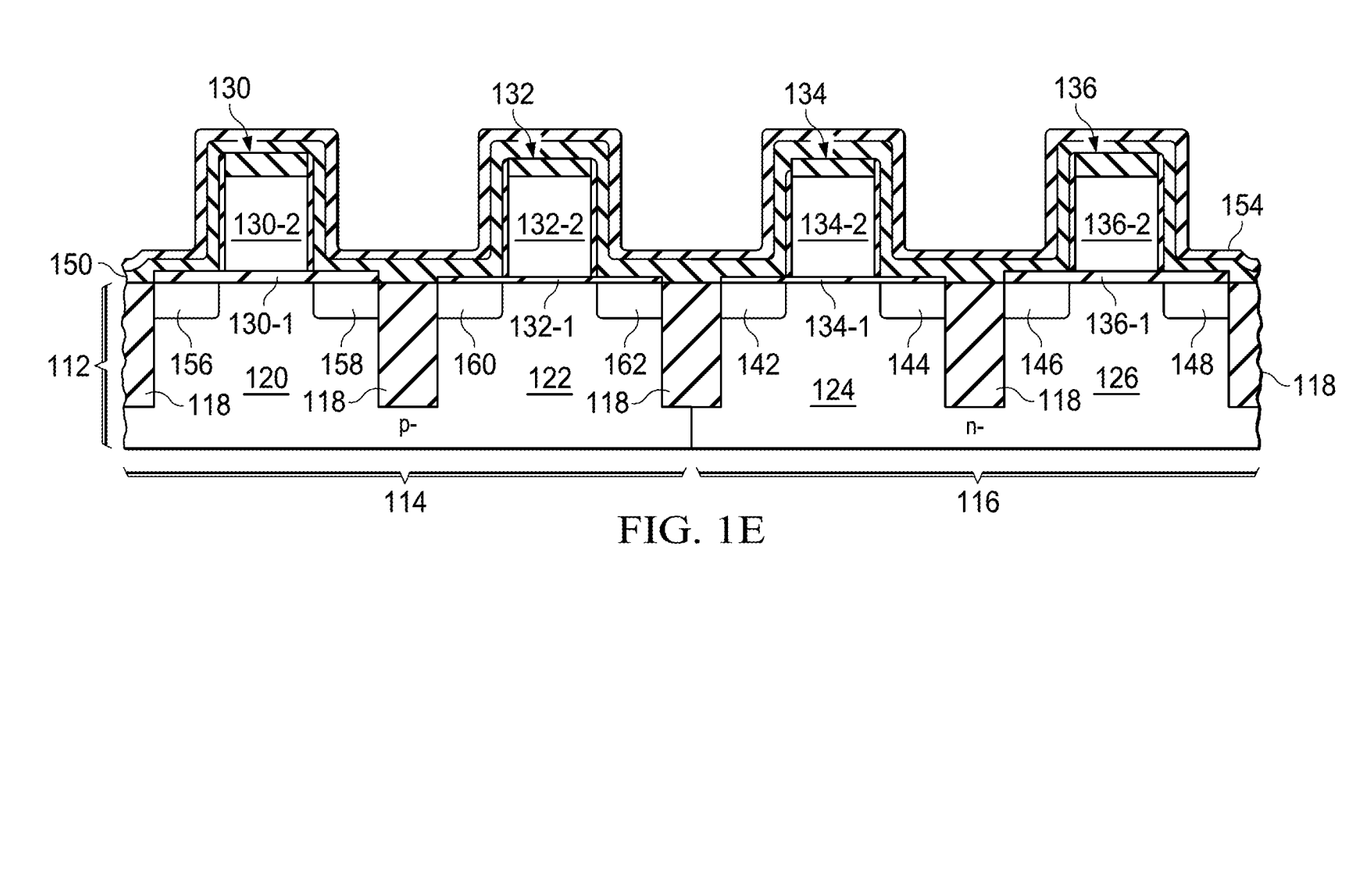

Next, as shown in FIG. 1E, after patterned photoresist layer 152 has been removed, a stress layer 154 is conventionally deposited on non-conductive layer 150. The bottom surface of stress layer 154 is etch selective to the top surface of non-conductive layer 150. In addition, the stress within stress layer 154 increases when subjected to a heat treatment. In the present example, stress layer 154 is implemented with a nitride layer. A nitride layer can be formed in a conventional low-temperature manner using, for example, hexachlorodisilane (HCD) or tertiary-butylamino silane (BTBAS) processes.

Following the formation of stress layer 154, the implanted n-type dopant is driven in (e.g., annealed at 1100° C. in a neutral ambient such as N₂) to form spaced-apart NLDD source and drain regions 156 and 158 in p-type substrate portion 120, and spaced-apart NLDD source and drain regions 160 and 162 in p-type substrate portion 122.

The drive in, however, also increases the stress within stress layer 154, which transmits the stress to the channel regions in the substrate portions 120 and 122 and the substrate portions 124 and 126. When the single-crystal silicon that was damaged from the n-type implant is recrystallized during the anneal, the recrystallization forms a lattice that supports and maintains the stressed channel regions in the p-type substrate portions 120 and 122.

One of the advantages of the present example is that since a p-type dopant was implanted and annealed to form the PLDD regions 142, 144, 148, and 148 before the n-type dopant was implanted, relatively little additional recrystallization occurs in the PLDD regions 142, 144, 148, and 148 in response to the anneal that forms the NLDD regions 156, 158, 160, and 162. As a result, when stress layer 154 is subsequently removed, the channel regions within the n-type substrate portions 124 and 126 retain very little of the stress that was introduced by annealing stress layer 154.

Another important advantage of non-conductive layer 150 is that the NLDD regions 156, 158, 160, and 162 can be spaced away from the gate structures 130 and 132 with the distance determined by the thickness of non-conductive layer 150. This can give another freedom of device design to improve performance. Non-conductive layer 150 can also make shallower source and drain junctions, which will ameliorate adverse short channel effects.

Figure 1F:
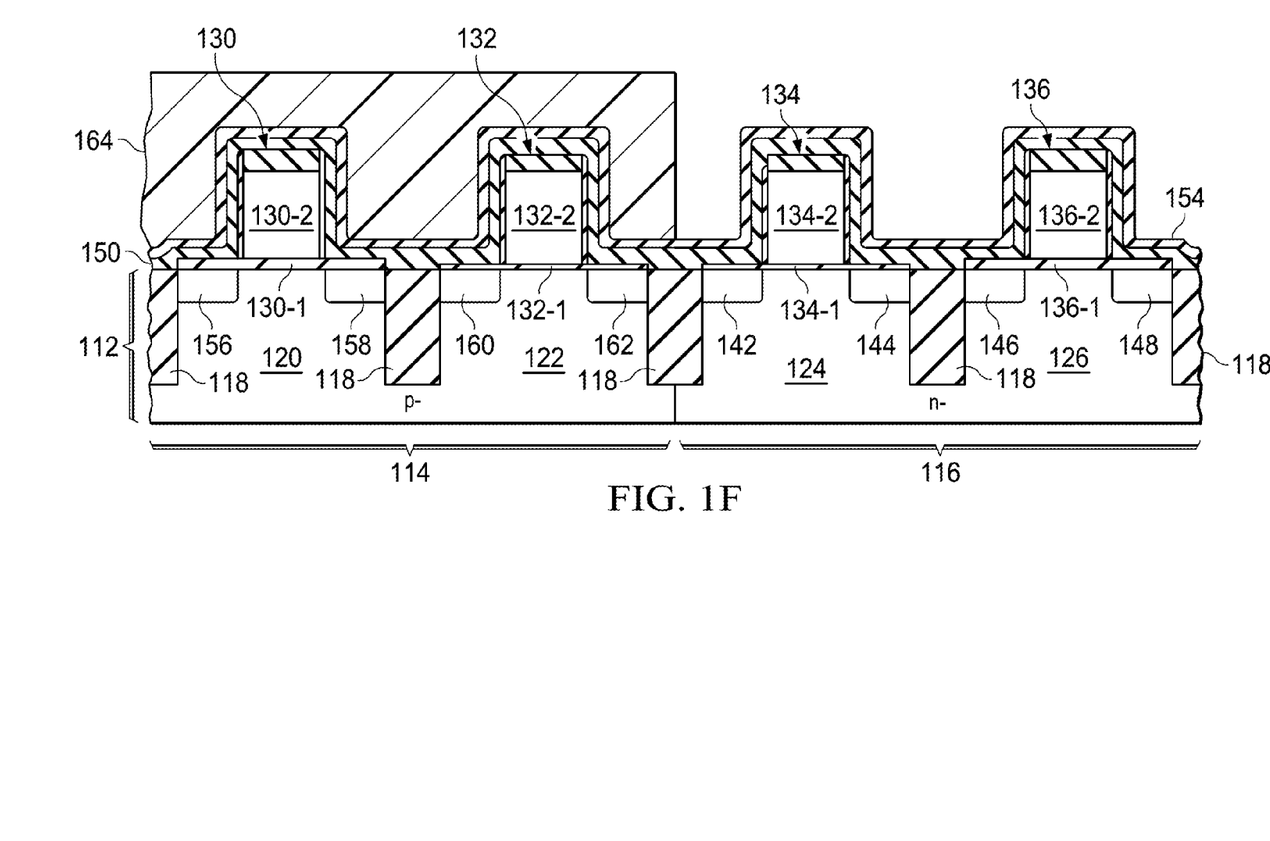

Following this, as shown in FIG. 1F, after the NLDD source and drain regions 156 and 158 and the NLDD source and drain region 160 and 162 have been formed, a patterned photoresist layer 164 is formed in a conventional fashion to touch stress layer 154 and protect the region of stress layer 154 that lies over the p-type substrate portions 120 and 122 and the NMOS transistor gate structures 130 and 132.

Figure 1G:
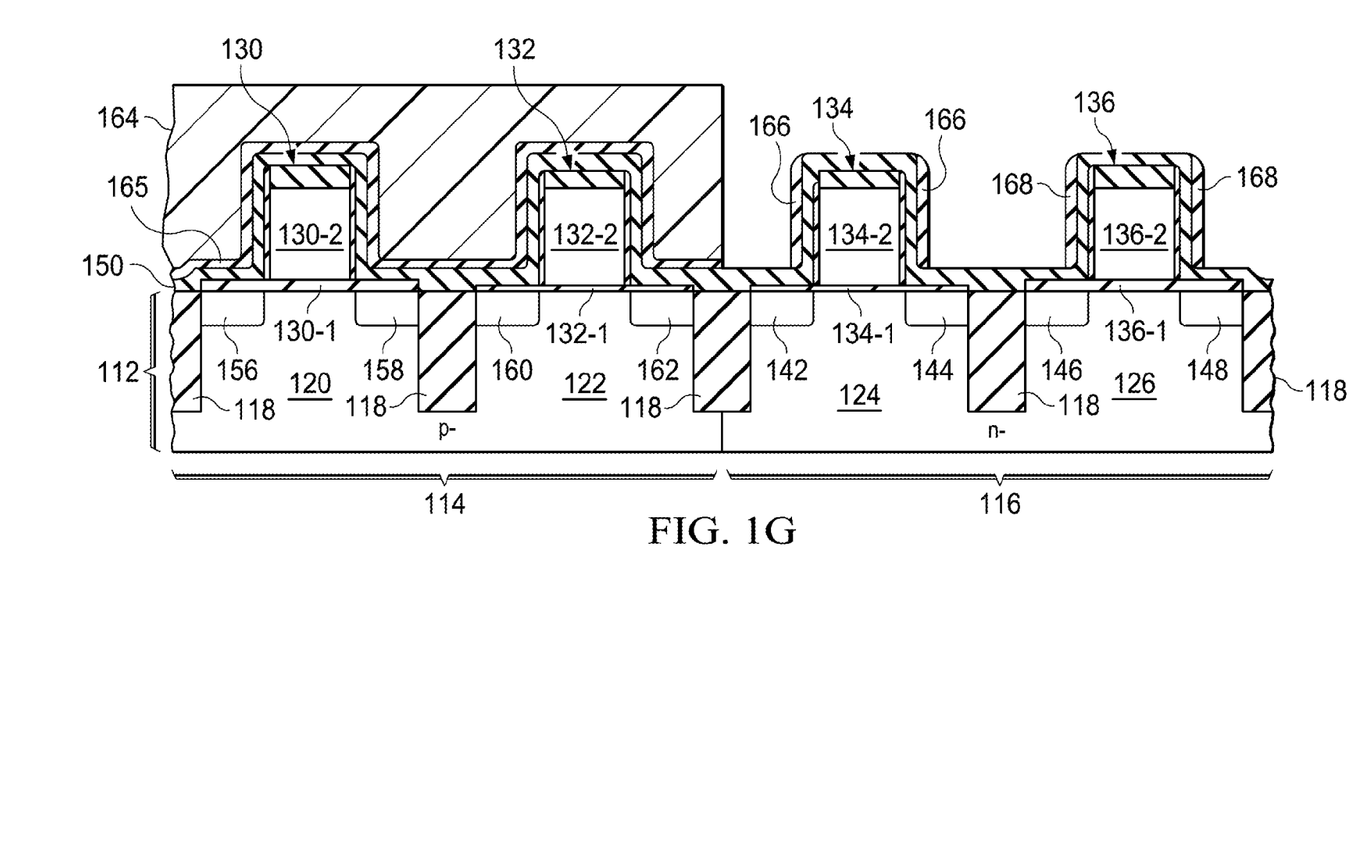

Following the formation of patterned photoresist layer 164, as shown in FIG. 1G, the exposed region of stress layer 154 is anisotropically etched in a conventional manner to form a protected section 165, a side wall spacer 166, and a side wall spacer 168. Protected section 165 remains over the p-type substrate portions 120 and 122 and the NMOS transistor gate structures 130 and 132. Side wall spacer 166 touches non-conductive layer 150 and laterally surrounds PMOS transistor gate structure 134, while side wall spacer 168 touches non-conductive layer 150 and laterally surrounds PMOS transistor gate structure 136. Side wall spacers 166 and 168 are spaced apart from each other as well as from protected section 165.

Figure 1H:
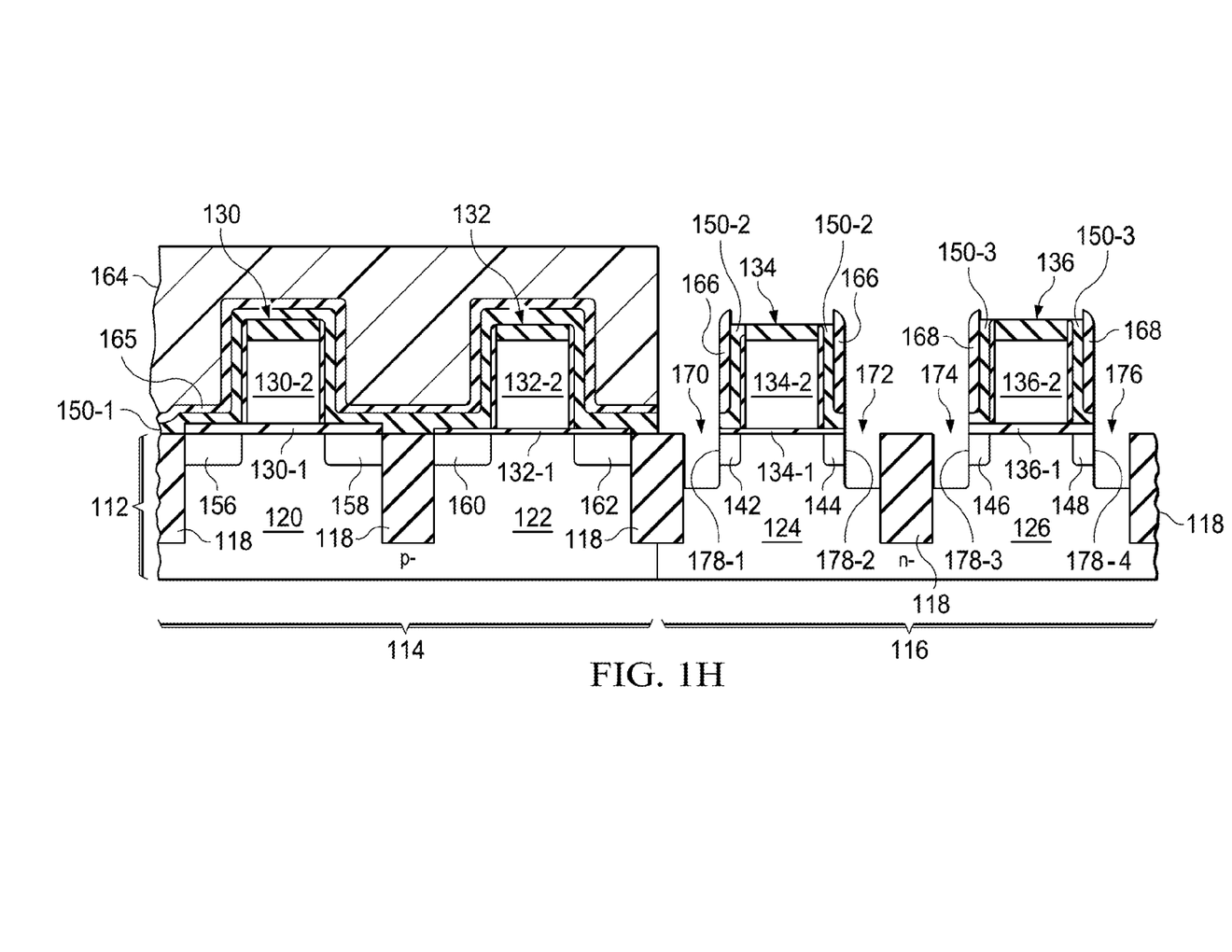

As shown in FIG. 1H, after protected section 165 and the side wall spacers 166 and 168 have been formed, the exposed portion of non-conductive layer 150 is anisotropically etched in a conventional manner to form a protected section 150-1, a side wall spacer 150-2, and a side wall spacer 150-3.

Protected section 150-1 remains over the p-type substrate portions 120 and 122 and the NMOS transistor gate structures 130 and 132. Side wall spacer 150-2 touches and laterally surrounds PMOS transistor gate structure 134, while side wall spacer 150-3 touches and laterally surrounds PMOS transistor gate structure 136. Side wall spacers 150-2 and 150-3 are spaced apart from each other as well as from protected section 150-1.

Following this, one or more materials are simultaneously etched to form a source trench 170 and a drain trench 172 in n-type substrate portion 124, and a source trench 174 and a drain trench 176 in n-type substrate portion 126. Source trench 170 exposes an interior portion 178-1 of PLDD source region 142, while drain trench 172 exposes an interior portion 178-2 of PLDD drain region 144. Source trench 174 exposes an interior portion 178-3 of PLDD source region 146, while drain trench 176 exposes an interior portion 178-4 of PLDD drain region 148.

In the present example, the source and drain trenches 170 and 172 and the source and drain trenches 174 and 176 are formed by anisotropically etching the exposed portions of the gate insulation layers 134-1 and 136-1, the underlying portions of the PLDD regions 142, 144, 146, and 148, portions of n-type substrate portion 124, and portions of n-type substrate portion 126. Once the source and drain trenches 170 and 172 in low-voltage substrate portion 124 and the source and drain trenches 174 and 176 in high-voltage substrate portion 126 have been formed, patterned photoresist layer 164 is removed in a conventional manner.

Figure 1I:
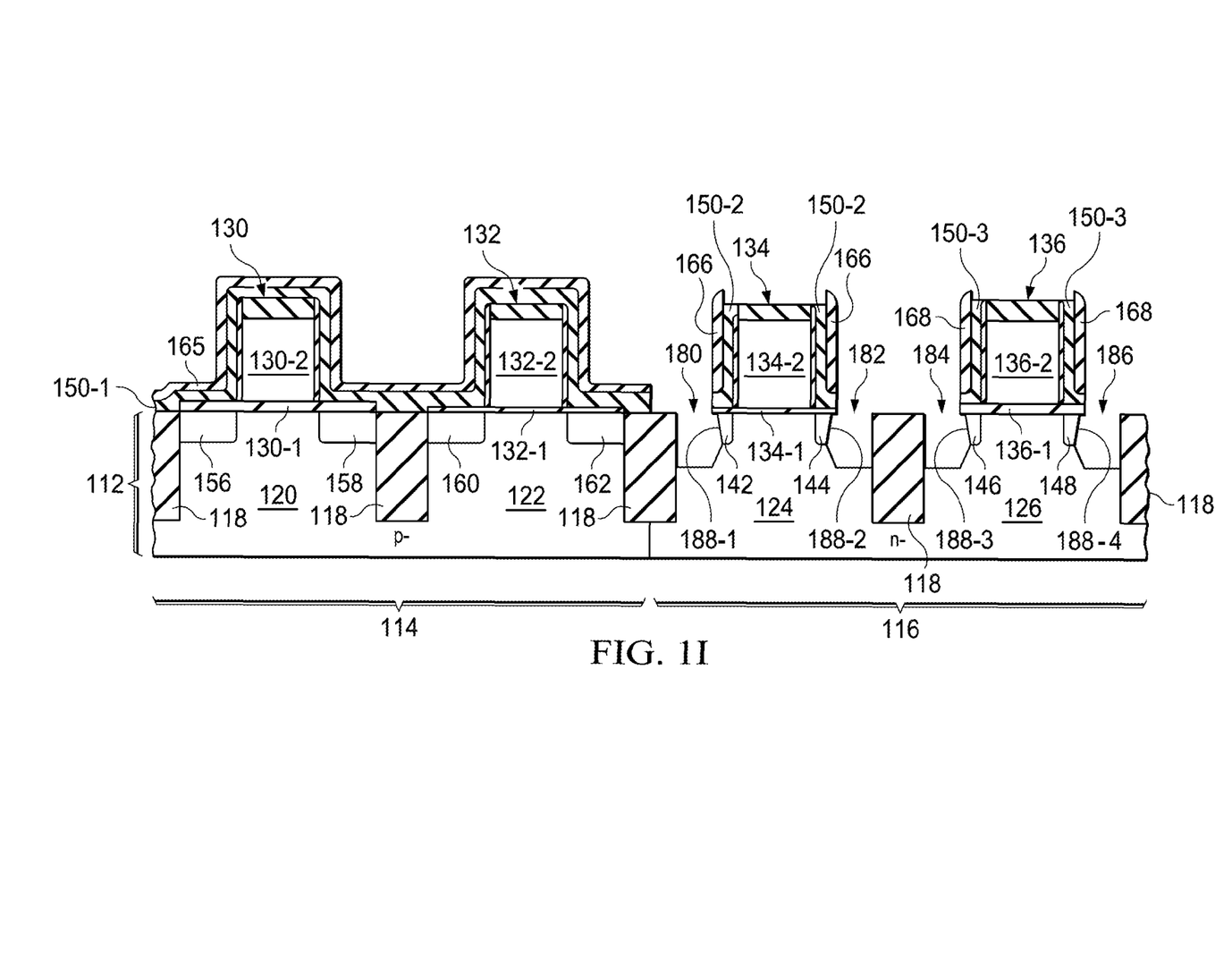

Next, as shown in FIG. 1I, the exposed portions of single-crystal-silicon in the source and drain trenches 170 and 172 and the source and drain trenches 174 and 176 are conventionally wet etched to form source and drain cavities 180 and 182 in low-voltage substrate portion 124 and source and drain cavities 184 and 186 in high-voltage substrate portion 126. The cavities 180, 182, 184, and 186 are then rinsed and cleaned in a conventional fashion.

Source cavity 180 exposes an interior portion 188-1 of PLDD source region 142, while drain cavity 182 exposes an interior portion 188-2 of PLDD drain region 144. Source cavity 184 exposes an interior portion 188-3 of PLDD source region 146, while drain cavity 186 exposes an interior portion 188-4 of PLDD drain region 148.

Figure 1J:
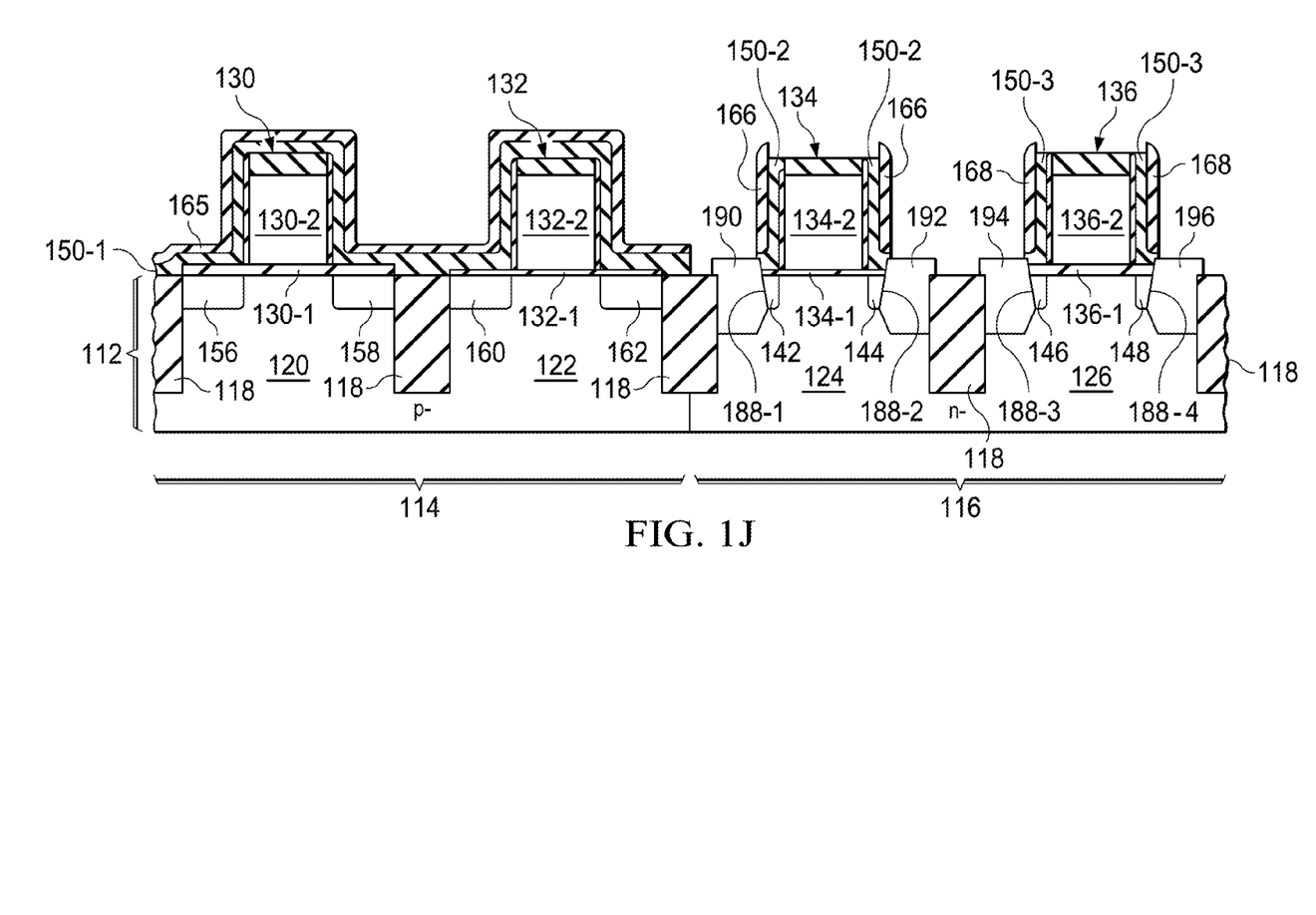

Following this, as shown in FIG. 1J, p-type silicon germanium is epitaxially grown in the cavities 180, 182, 184, and 186 in a conventional manner to form a p-type SiGe source region 190, a p-type SiGe drain region 192, a p-type SiGe source region 194, and a p-type SiGe drain region 196.

P-type SiGe source region 190 touches interior portion 188-1 of PLDD source region 142, while p-type SiGe drain region 192 touches interior portion 188-2 of PLDD drain region 144. In addition, p-type SiGe source region 194 touches interior portion 188-3 of PLDD source region 146, while p-type SiGe drain region 196 touches interior portion 188-4 of PLDD source region 148.

Figure 1K:
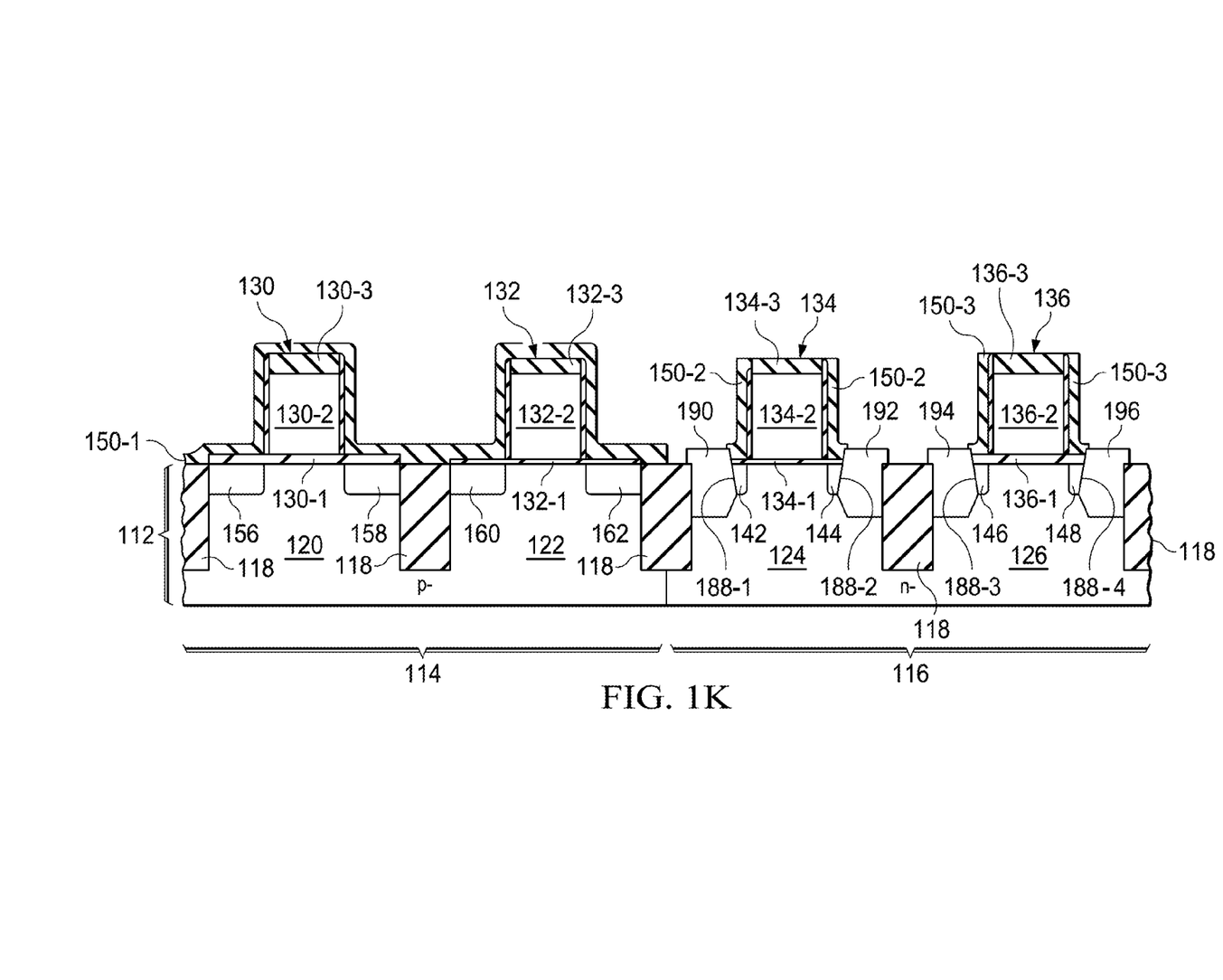

Next, as shown in FIG. 1K, protected section 165 and the side wall spacers 166 and 168 are removed in a conventional manner with an etchant that is etch selective (removes substantially more of protected section 165 and the side wall spacers 166 and 168 than the other materials) to non-conductive layer 150 as well as the p-type SiGe source and SiGe drain regions 190 and 192 and the p-type SiGe source and drain regions 194 and 196, and the cap regions 130-3, 132-3, 134-3, and 136-3.

Figure 1L:
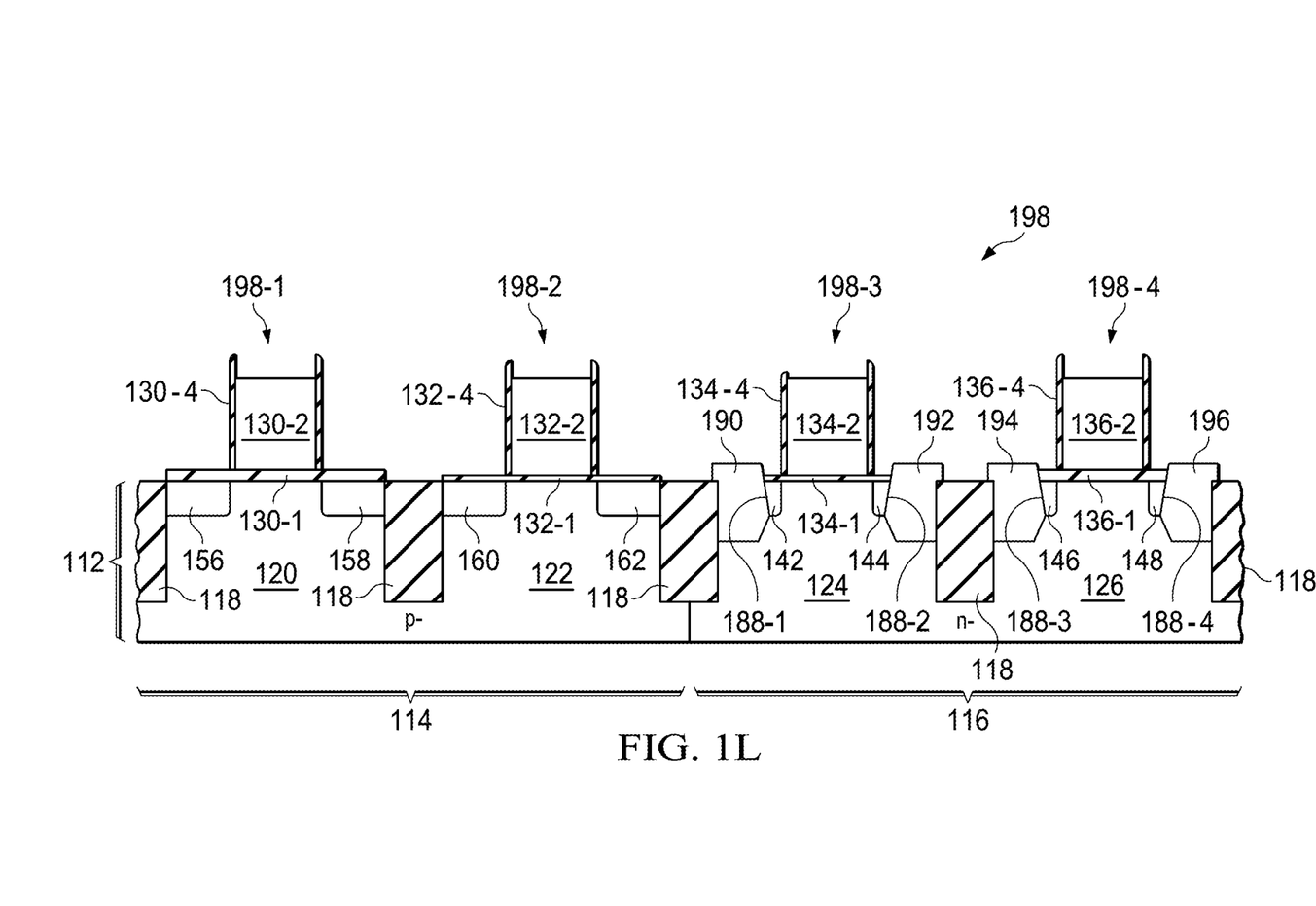

As shown in FIG. 1L, after protected section 165 and the side wall spacers 166 and 168 have been removed, protected section 150-1, side wall spacer 150-2, and side wall spacer 150-3 are removed in a conventional manner with an etchant that is etch selective to the side wall spacers 130-4, 132-4, 134-4, and 136-4 (i.e., removes substantially more of protected section 150-1, side wall spacer 150-2, and side wall spacer 150-3 than the side wall spacers 130-4, 132-4, 134-4, and 136-4).

Following the removal of protected section 150-1, side wall spacer 150-2, and side wall spacer 150-3, the cap regions 130-3, 132-3, 134-3, and 136-3 are removed in a conventional manner to form a CMOS device 198 that includes a high-voltage stressed-channel NMOS transistor structure 198-1, a low-voltage stressed-channel NMOS transistor structure 198-2, a low-voltage strained-channel PMOS transistor structure 198-3, and a high-voltage strained-channel PMOS transistor structure 198-4. Following this, method 100 continues with conventional steps.

Thus, a method of forming a CMOS device that has high-voltage and low-voltage stressed-channel NMOS transistors, and high-voltage and low-voltage strained-channel PMOS transistors has been described. One of the advantages of the present example is that stress in the channel regions of the PMOS transistors is minimized by implanting and annealing the p-type source and drain regions before the stress layer is formed. Further, strain is introduced into the channel of the PMOS transistor by growing SiGe source and drain regions.

Another advantage of the present example is that the n-type dopant is implanted through non-conductive layer 150, which allows for very shallow implants. When annealed, very shallow implants form very shallow source and drain regions. The mobility of electrons increases as the stress from the stress memorization layer is transferred to the channel region. Also, decreased source and drain junction regions allow better short channel control. The method 100 enables therefore both higher mobility and improved short channel control, which improves performance and reduces leakage current.

A further advantage of the present example is that the stress layer used in a conventional stressed-channel process is commonly formed on a buffer oxide layer. In the present example, stress layer 154 is formed on non-conductive layer 150, which eliminates the need to form a separate buffer layer as is conventionally the case, thereby saving fabrication steps.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a semiconductor device comprising:
   implanting spaced-apart portions of an n-type single-crystal-silicon substrate region with a p-type dopant;
   annealing the n-type single-crystal-silicon substrate region implanted with the p-type dopant to form a p-type source region and a p-type drain region that lie spaced apart in the n-type single-crystal-silicon substrate region;
   after implanting and annealing the n-type single-crystal-silicon substrate region, forming a non-conductive layer that touches an n-channel transistor gate structure and a p-channel transistor gate structure, the n-channel transistor gate structure touching a p-type single-crystal-silicon substrate region, the p-channel transistor gate structure touching the n-type single-crystal-silicon substrate region;
   implanting spaced-apart portions of the p-type single-crystal-silicon substrate region through the non-conductive layer with an n-type dopant; and
   forming a stress layer that touches and covers the non-conductive layer after the n-type dopant has been implanted, the stress layer being substantially etch selective to the non-conductive layer.

2. The method of claim 1 and further comprising annealing the p-type single-crystal-silicon substrate region after the stress layer has been formed to form an n-type source region and an n-type drain region that lie spaced apart in the p-type single-crystal-silicon substrate region.

3. The method of claim 2 and further comprising etching the stress layer after the n-type source region and the n-type drain region have been formed to form a protected stress section that lies over the p-type single-crystal-silicon substrate region, and a side wall stress spacer that touches the non-conductive layer and lies horizontally adjacent to the p-type transistor gate structure.

4. The method of claim 3 and further comprising etching the non-conductive layer after the protected stress section and the side wall stress spacer have been formed to form a protected non-conductive section that lies over the p-type single-crystal-silicon substrate region, and a side wall non-conductive spacer that touches and lies horizontally adjacent to the p-type transistor gate structure.

5. The method of claim 4 and further comprising etching to form a source cavity and a drain cavity in the n-type single-crystal-silicon substrate region after the protected non-conductive section and the side wall non-conductive spacer have been formed, the source cavity and the drain cavity being spaced apart, the source cavity exposing an interior portion of the p-type source region, the drain cavity exposing an interior portion of the p-type drain region.

6. The method of claim 5 wherein a channel portion of the n-type single-crystal-silicon substrate region lies horizontally between the source cavity and the drain cavity, the channel portion lying directly below the p-channel transistor gate structure.

7. The method of claim 6 and further comprising simultaneously growing a silicon germanium (SiGe) source region in the source cavity to touch the interior portion of the p-type source region, and a SiGe drain region in the drain cavity to touch the interior portion of the p-type drain region.

8. The method of claim 7 and further comprising removing the protected stress section and the side wall stress spacer after the SiGe source region and the SiGe drain region have been formed.

9. The method of claim 8 and further comprising removing the protected non-conductive section and the side wall non-conductive spacer after the protected stress section and the side wall stress spacer have been removed.

10. The method of claim 9 wherein the non-conductive layer includes oxide, and the stress layer includes nitride.

11. A method of forming a semiconductor device comprising:
    forming a non-conductive layer that touches an n-channel transistor gate structure and a p-channel transistor gate structure, the n-channel transistor gate structure touching a p-type single-crystal-silicon substrate region, the p-channel transistor gate structure touching an n-type single-crystal-silicon substrate region;

implanting spaced-apart portions of the p-type single-crystal-silicon substrate region through the non-conductive layer with an n-type dopant;

forming a stress layer that touches and covers the non-conductive layer after the n-type dopant has been implanted, the stress layer being substantially etch selective to the non-conductive layer; and annealing the p-type single-crystal-silicon substrate region after the stress layer has been formed to form an n-type source region and an n-type drain region that lie spaced apart in the p-type single-crystal-silicon substrate region;

and further comprising implanting spaced-apart portions of the n-type single-crystal-silicon substrate region with a p-type dopant before the non-conductive layer is formed.

12. The method of claim 11 and further comprising etching the stress layer after the n-type source region and the n-type drain region have been formed to form a protected stress section that lies over the p-type single-crystal-silicon substrate region, and a side wall stress spacer that touches the non-conductive layer and lies horizontally adjacent to the p-type transistor gate structure.

13. The method of claim 12 and further comprising etching the non-conductive layer after the protected stress section and the side wall stress spacer have been formed to form a protected non-conductive section that lies over the p-type single-crystal-silicon substrate region, and a side wall non-conductive spacer that touches and lies laterally adjacent to the p-type transistor gate structure.

14. The method of claim 13 and further comprising etching to form a source cavity and a drain cavity in the n-type single-crystal-silicon substrate region after the protected non-conductive section and the side wall non-conductive spacer have been formed, the source cavity and the drain cavity being spaced apart, the source cavity exposing an interior portion of the p-type source region, the drain cavity exposing an interior portion of the p-type drain region.

15. The method of claim 14 wherein a channel portion of the n-type single-crystal-silicon substrate region lies horizontally between the source cavity and the drain cavity, the channel portion lying directly below the p-channel transistor gate structure.

16. The method of claim 15 and further comprising simultaneously growing a silicon germanium (SiGe) source region in the source cavity to touch the interior portion of the p-type source region, and a SiGe drain region in the drain cavity to touch the interior portion of the p-type drain region.

17. The method of claim 16 and further comprising removing the protected stress section and the side wall stress spacer after the SiGe source region and the SiGe drain region have been formed.

18. The method of claim 17 and further comprising removing the protected non-conductive section and the side wall non-conductive spacer after the protected stress section and the side wall stress spacer have been removed.

19. The method of claim 17 and further comprising annealing the n-type single-crystal-silicon substrate region implanted with the p-type dopant to form a p-type source region and a p-type drain region that lie spaced apart in the n-type single-crystal-silicon substrate region before the non-conductive layer is formed.

20. A method of fabricating a semiconductor device, comprising the following steps performed in order:

forming an NMOS transistor gate structure over a p-type substrate region and a PMOS transistor gate structure over an n-type substrate region;

forming PLDD (p-type lightly doped drain) regions in the n-type substrate region;

forming a non-conductive layer over the p-type substrate region and the n-type substrate region including over the NMOS transistor gate structure and the PMOS transistor gate structure;

performing an NLDD (n-type lightly doped drain) implant through the non-conductive layer into the p-type substrate region;

forming a stress layer directly on the non-conductive layer, the stress layer being substantially etch selective to the non-conductive layer;

with the stress layer and non-conductive layer overlying both the p-type substrate region and the n-type substrate region, annealing the p-type substrate region to form NLDD regions in the p-type substrate region;

while a first portion of the stress layer over the p-type substrate region is masked, etching a second portion of the stress layer over the n-type substrate region to form sidewall spacers adjacent the PMOS transistor gate structure leaving the first portion of the stress layer intact over the p-type substrate region;

using the first portion of the stress layer and the sidewall spacers as a mask, etching a source cavity and a drain cavity in the n-type substrate region;

filling the source cavity and the drain cavity with SiGe; and removing the first portion of the stress layer, the sidewall spacers, and the non-conductive layer.

\* \* \* \* \*